US012810914B2

(12) United States Patent
Kang et al.

(10) Patent No.: US 12,810,914 B2
(45) Date of Patent: Nov. 24, 2026

(54) GATE DRIVER CIRCUIT AND MEMORY DEVICE INCLUDING THE SAME

(71) Applicant: Samsung Electronics Co., Ltd., Suwon-si (KR)

(72) Inventors: Gyuseong Kang, Suwon-si (KR); Eunji Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 72 days.

(21) Appl. No.: 18/670,910

(22) Filed: May 22, 2024

(65) Prior Publication Data

US 2025/0014619 A1 Jan. 9, 2025

(30) Foreign Application Priority Data

Jul. 3, 2023 (KR) ........................ 10-2023-0086092

(51) Int. Cl.
*G11C 16/04* (2006.01)
*G11C 11/16* (2006.01)

(52) U.S. Cl.
CPC ........ *G11C 11/1657* (2013.01); *G11C 11/161* (2013.01); *G11C 11/1659* (2013.01); *G11C 11/1697* (2013.01)

(58) Field of Classification Search
CPC .............. G11C 11/1657; G11C 11/161; G11C 11/1659; G11C 11/1697; G11C 2013/0045; G11C 2013/0078; G11C 5/145; G11C 5/147; G11C 8/08; G11C 11/1655; G11C 11/1673; G11C 11/1675; G11C 13/0026; G11C 13/0028; G11C 13/0038; G11C 13/004; G11C 13/0069
See application file for complete search history.

(56) References Cited

U.S. PATENT DOCUMENTS 8,089,813 B2 1/2012 Dreps
8,159,899 B2 4/2012 Bolandrina et al.
(Continued)

FOREIGN PATENT DOCUMENTS

KR 10-0486222 B1 8/2005
KR 10-1275379 B1 6/2013

OTHER PUBLICATIONS

EPO Search Report dated Nov. 19, 2024 from the EPO in respect of the EP Patent Application No. 24182846.6.
(Continued)

*Primary Examiner* — Pho M Luu
(74) *Attorney, Agent, or Firm* — Muir Patent Law, PLLC

(57) ABSTRACT

A memory device includes a memory cell having an access transistor and a variable resistance element, a word line connected to a gate of the access transistor, and a gate driver circuit configured to provide a word line voltage to the word line in a read operation or a write operation, receive, during the read operation, a first power supply voltage from a power terminal and provide a second power supply voltage lower than the first power supply voltage to the word line by attenuating the first power supply voltage to the second power supply voltage, and receive, during the write operation, a third power supply voltage higher than the first power supply voltage from the power terminal and provide the third power supply voltage to the word line without attenuating the third power supply voltage.

20 Claims, 14 Drawing Sheets

(56) References Cited

U.S. PATENT DOCUMENTS

| | | | | |
|---|---|---|---|---|
| 8,441,885 | B2 | 5/2013 | Chan et al. | |
| 8,456,789 | B2 * | 6/2013 | Van Swearingen | H01R 24/48 361/111 |
| 8,842,489 | B2 | 9/2014 | Yu et al. | |
| 9,406,351 | B2 * | 8/2016 | Stansfield | G11C 11/419 |
| 9,570,133 | B2 | 2/2017 | Chen et al. | |
| 10,079,056 | B2 * | 9/2018 | Gupta | G11C 11/419 |
| 10,699,761 | B2 * | 6/2020 | Berger | G11C 11/1657 |
| 10,861,546 | B2 | 12/2020 | Park et al. | |
| 11,170,849 | B1 | 11/2021 | Choy et al. | |
| 2013/0135925 | A1 * | 5/2013 | Scheuerlein | G11C 13/0069 365/163 |

OTHER PUBLICATIONS

Kang, Gyuseong, et al., "A 14nm 128Mb Embedded MRAM Macro achieved the Best Figure-Of-Merit with 80MHz Read operation and 18.1 $Mb/mm^2$ implementation at 0.64 V", 2023 IEEE Symposium on VLSI Technology and Circuits (VLSI Technology and Circuits). IEEE, 2023.

* cited by examiner

GATE DRIVER CIRCUIT AND MEMORY DEVICE INCLUDING THE SAME

CROSS-REFERENCE TO RELATED APPLICATIONS

This application claims priority under 35 U.S.C. § 119 to Korean Patent Application No. 10-2023-0086092 filed on Jul. 3, 2023, in the Korean Intellectual Property Office, the disclosures of which are incorporated by reference herein in their entireties.

BACKGROUND

Example embodiments of the present disclosure described herein relate to a semiconductor memory device, and more particularly, relate to a memory device including a gate driver circuit.

Semiconductor memories may be classified as a volatile memory or a non-volatile memory, for example. Typically, the volatile memories (e.g., a dynamic random access memory (DRAM) or a static random access memory (SRAM)) may exhibit faster read and/or write speeds when compared to the non-volatile memory. However, data stored in the volatile memory may disappear when a power applied to the volatile memory is turned off. In contrast, the non-volatile memory may retain the data even when the power is turned off.

A magnetoresistive random-access memory (MRAM) may include a magnetic tunnel junction (MTJ). The magnetization direction of the MTJ may change according to the direction of the current applied to the MTJ. The resistance value of the MTJ may vary according to the magnetization direction of the MTJ. MRAM may store or read data using these MTJ characteristics.

The MRAM may perform a read operation by comparing the resistance distribution R0 with data 0 and the reference resistance Rref having an intermediate size between the resistance distribution R1 with data 1. However, the resistance distribution of MRAM may vary due to the influence of the resistance component and/or capacitor component of the MTJ, or word lines, etc. The rising time of a word line may vary depending on the number of memory cells connected to the word line. As the number of memory cells increases, the operation speed may slow down during read or write operations due to the resistance or capacitor components of MTJ or the word line.

SUMMARY

Example embodiments of the present disclosure provide a gate driver capable of reducing the rising time of the word line voltage even if the rising time of the word line voltage increases due to an increase in the number of memory cells connected to one word line.

Example embodiments of the present disclosure provide a memory device that may reduce the decrease in operating speed due to resistance or capacitor components of word lines or memory cells.

According to an aspect of the present disclosure, a memory device includes a memory cell having an access transistor and a variable resistance element, a word line connected to a gate of the access transistor, and a gate driver circuit configured to: provide a word line voltage to the word line in a read operation or a write operation, receive, during the read operation, a first power supply voltage from a power terminal and provide a second power supply voltage lower than the first power supply voltage to the word line by attenuating the first power supply voltage to the second power supply voltage, and receive, during the write operation, a third power supply voltage higher than the first power supply voltage from the power terminal and provide the third power supply voltage to the word line without attenuating the third power supply voltage.

According to an aspect of the present disclosure, a memory device includes a memory cell array including a word line and a plurality of memory cells connected thereto, a column decoder connected to the plurality of memory cells through a plurality of source lines and a plurality of bit lines and configured to select the plurality of memory cells by a column line, and a gate driver circuit configured to: provide a word line voltage to the word line in a read operation or a write operation, receive, during the read operation, a first power supply voltage from a power terminal and provide a second power supply voltage lower than the first power supply voltage to the word line by attenuating the first power supply voltage to the second power supply voltage, and receive, during the write operation, a third power supply voltage higher than the first power supply voltage from the power terminal and provide the third power supply voltage to the word line without attenuating the third power supply voltage.

According to an aspect of the present disclosure, a gate driver circuit of a memory device includes a driver control circuit configured to generate a word line enable signal, a write enable signal, a gate control signal, a first PMOS transistor connected between a power terminal and a first node, and configured to operate in response to the word line enable signal, a second PMOS transistor connected between the first node and a second node connected to the word line, and configured to operate in response to the write enable signal, a first NMOS transistor connected between the first node and the second node, and configured to operate in response to the gate control signal, and a second NMOS transistor connected between the second node and a ground terminal, and configured to operate in response to the word line enable signal. During a read operation, the gate driver circuit receives a first power supply voltage from the power terminal and provides a second power supply voltage lower than the first power supply voltage to the word line through attenuating the first power supply voltage to the second power supply voltage. During a write operation, the gate driver circuit receives a third power supply voltage higher than the first power supply voltage from the power terminal and provides the third power supply voltage to the word line without attenuating the third power supply voltage.

BRIEF DESCRIPTION OF THE FIGURES

The above and other objects and features of the present disclosure will become apparent by describing in detail embodiments thereof with reference to the accompanying drawings.

DETAILED DESCRIPTION

Below, example embodiments of the present disclosure will be described in detail and clearly to such an extent that an ordinary one in the art easily implements the inventive concepts.

Figure 1:
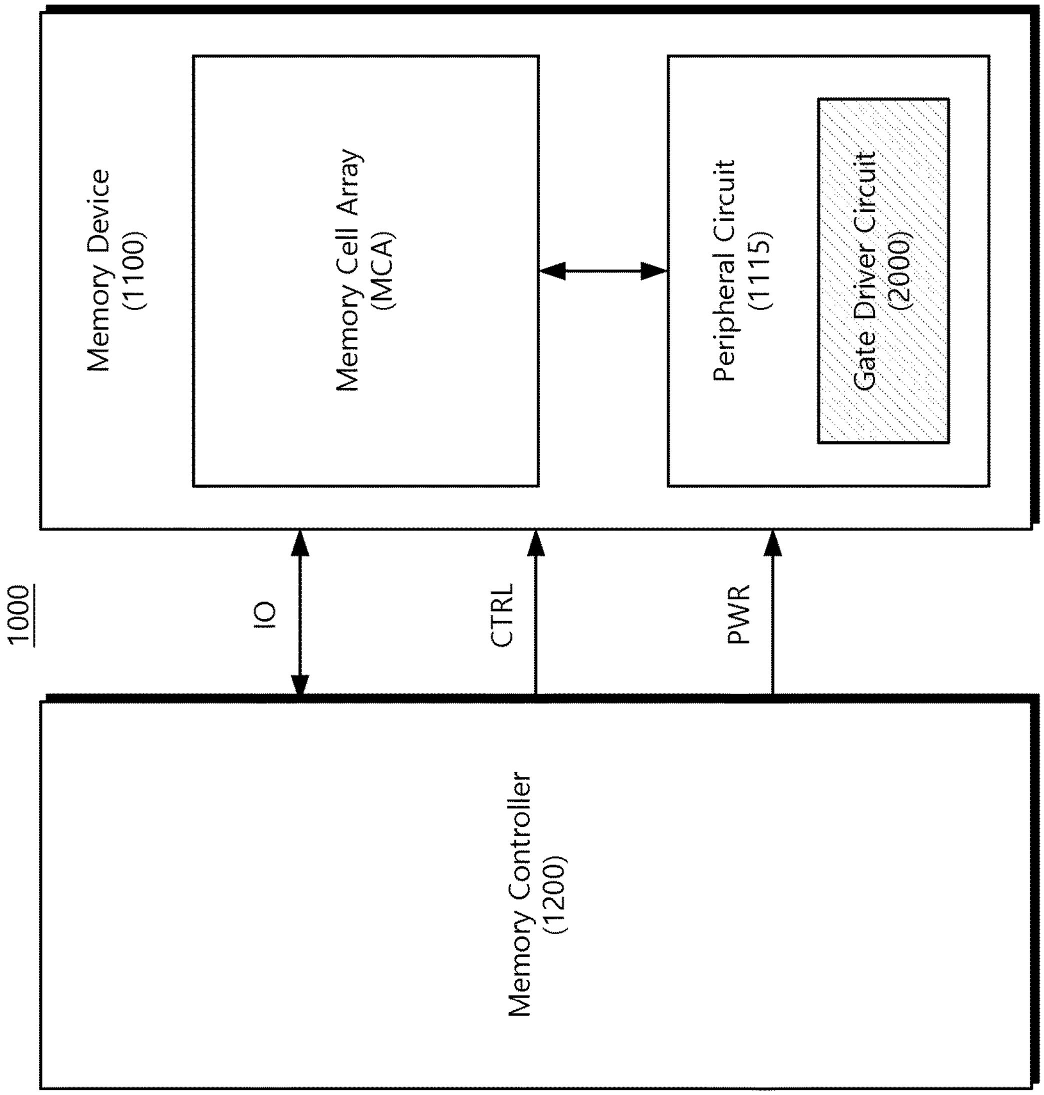
FIG. 1 is a block diagram illustrating a storage device according to an example embodiment of the present disclosure.

FIG. 1 is a block diagram illustrating a storage device according to an example embodiment of the present disclosure. The storage device 1000 may be a flash storage device based on a flash memory. For example, the storage device 1000 may be implemented as a solid-state drive (SSD), a universal flash storage (UFS), a memory card, or the like.

Referring to FIG. 1, the storage device 1000 may include a memory device 1100 and a memory controller 1200. The memory device 1100 may receive input/output signals IO from the memory controller 1200 through input/output lines, receive control signals CTRL through control lines, and receive external power supply PWR through power lines. The storage device 1000 may store data in the memory device 1100 under the control of the memory controller 1200.

The memory device 1100 may include a memory cell array MCA and a peripheral circuit 1115. The memory cell array MCA may include a plurality of memory blocks. Each memory block may have a vertical 3D structure. Each memory block may include a plurality of memory cells. Multi-bit data may be stored in each memory cell.

The memory cell array MCA may be located (e.g., disposed) next to or above the peripheral circuit 1115 in terms of the design layout structure. A structure in which the memory cell array MCA is positioned over the peripheral circuit 1115 may be referred to as a cell on peripheral (COP) structure.

In an example embodiment, the memory cell array MCA may be manufactured as a chip separate from the peripheral circuit 1115. An upper chip including the memory cell array MCA and a lower chip including the peripheral circuit 1115 may be connected to each other by a bonding method. Such a structure may be referred to as a chip-to-chip (C2C) structure.

The peripheral circuit 1115 may include analog circuits and/or digital circuits which serve to store data in the memory cell array MCA or read data stored in the memory cell array MCA. The peripheral circuit 1115 may receive the external power PWR through power lines and generate internal powers of various levels.

The peripheral circuit 1115 may receive commands, addresses, and/or data from the memory controller 1200 through input/output lines. The peripheral circuit 1115 may store data in the memory cell array MCA according to the control signals CTRL. The peripheral circuit 1115 may read data stored in the memory cell array MCA and provide the read data to the memory controller 1200.

The peripheral circuit 1115 may include a gate driver circuit 2000. The gate driver circuit 2000 may be connected to the memory cell array 1110 through a plurality of word lines. The gate driver circuit 2000 may provide a word line voltage to a selected word line during a read or write operation. As the number of memory cells connected to one word line increases, the time for the word line voltage to reach the desired target voltage may be delayed during a read or write operation due to the increased resistance and capacitance of the word line.

In a read operation, the gate driver circuit 2000 may receive a power supply voltage from a power terminal and provide a voltage lower than the power supply voltage to the word line through threshold voltage attenuation. In a write operation, the gate driver circuit 2000 may provide the voltage input from the power terminal to the word line without attenuating the threshold voltage. The storage device 1000 according to an example embodiment of the present disclosure may reduce the delay time of the word line voltage by using the gate driver circuit 2000.

Figure 2:
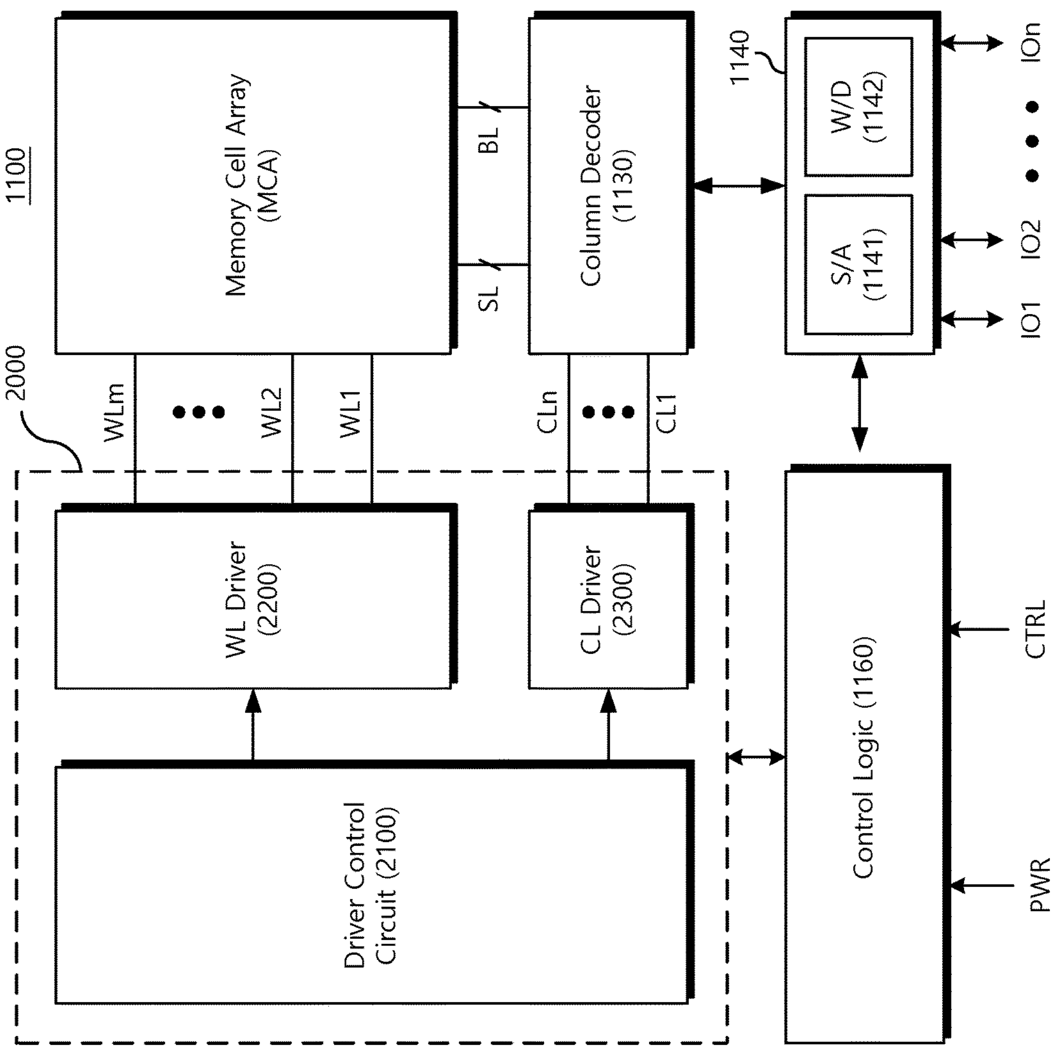
FIG. 2 is a block diagram illustrating an example embodiment of the memory device shown in FIG. 1.

FIG. 2 is a block diagram illustrating an example embodiment of the memory device shown in FIG. 1. The storage device 1000 of FIG. 1 may be a resistive storage device based on a resistive memory. For example, the memory device 1100 may be MRAM, Resistive random-access memory (ReRAM), or Phase-change random-access memory (PRAM).

Referring to FIGS. 1 and 2, the memory device 1100 may include a memory cell array 1110 and a peripheral circuit 1115. The peripheral circuit 1115 may include a column decoder 1130, an input/output circuit 1140, a control logic 1160, and a gate driver circuit 2000.

The memory cell array 1110 may include a plurality of memory blocks. Each memory block may be composed of a plurality of memory cells. Each memory cell may store multi-bit data. Each memory block may be connected to a plurality of word lines (WL1, WL2, . . . , WLm).

The column decoder 1130 may be connected to the memory cell array 1110 through a source line (SL) and/or a bit line (BL). The column decoder 1130 may select the source line SL or the bit line BL in response to the column line signals (CL1 to CLn) provided from the gate driver circuit 2000. The column decoder 1130 may select the source line (SL) or the bit line (BL) using a plurality of NMOS transistors (not shown).

The input/output circuit 1140 may be internally connected to the column decoder 1130 through data lines and externally connected to the memory controller (refer to FIG. 1, 1200) through the input/output lines IO1 to IOn. The input/output circuit 1140 may receive program data from the memory controller 1200 during a write operation (i.e., a program operation). Also, the input/output circuit 1140 may provide data read from the memory cell array 1110 to the memory controller 1200 during a read operation.

The input/output circuit 1140 may include a sense amplifier 1141 and a write driver 1142. The input/output circuit 1140 may receive or output data from input/output terminals. The number of input/output terminals may vary depending on the type of storage device 1000. The input/output circuit 1140 may provide data to the write driver 1142 in response to a control signal or output data provided from the sense amplifier 1141 to the outside.

The sense amplifier 1141 may read data stored in the selected memory cell by sensing a difference between the voltage of the source line SL and a reference voltage Vref during a read operation. The reference voltage Vref may be provided by a reference voltage generator circuit (not shown). The sense amplifier 1141 may operate in response to a control signal provided from the control unit 1160.

The write driver 1142 may receive a control signal from the control logic 1160 and provide a program current I_PGM to a data line. The program current I_PGM may be for programming the selected memory cell into one of multi-states. During the MLC program operation, the write driver 1142 may provide the program current I_PGM one or more times according to the multi-state of the selected memory cell.

The control logic 1160 may control read and/or write operations of the memory device 1100 using commands CMD, addresses ADDR, and control signals CTRL provided from the memory controller. The addresses ADDR may include a row address for selecting one memory block or one word line and a column address for selecting one memory cell.

The gate driver circuit 2000 may be connected to the memory cell array 1110 through a plurality of word lines (WL1 to WLm). The gate driver circuit 2000 may provide word line voltages to a selected word line during a read or write operation. The gate driver circuit 2000 may receive internal power from the control logic 1160 and generate word line voltages for reading or writing data.

The gate driver circuit 2000 may include a driver control circuit 2100, a word line driver 2200, and a column line driver 2300. The driver control circuit 2100 may provide control signals to the word line driver 2200 and/or the column line driver 2300 during a read or write operation. The word line driver 2200 and the column line driver 2300 may receive control signals from the driver control circuit 2100 and perform read or write operations.

The gate driver circuit 2000 may receive a power supply voltage from a power terminal during a read operation and provide voltages lower than the power supply voltage to the word line through threshold voltage attenuation. The gate driver circuit 2000 may provide the power voltage input from the power terminal to the word line without attenuating the threshold voltage during a write operation. The memory device 1100 according to an example embodiment of the present disclosure may reduce the delay time of the word line voltage by using the gate driver circuit 2000.

Figure 3:
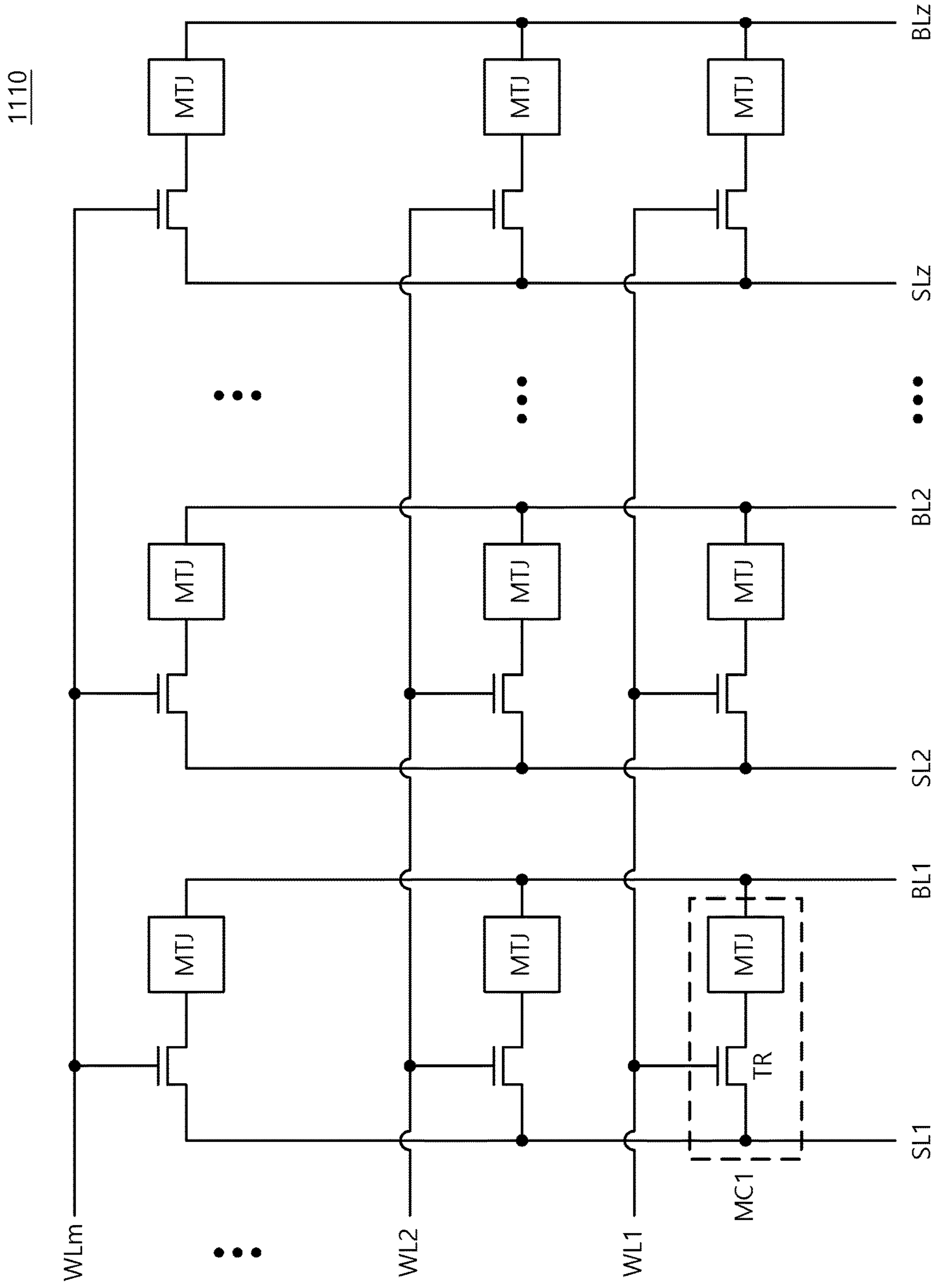
FIG. 3 is a diagram illustrating a memory cell array of FIG. 1.
Figure 4:
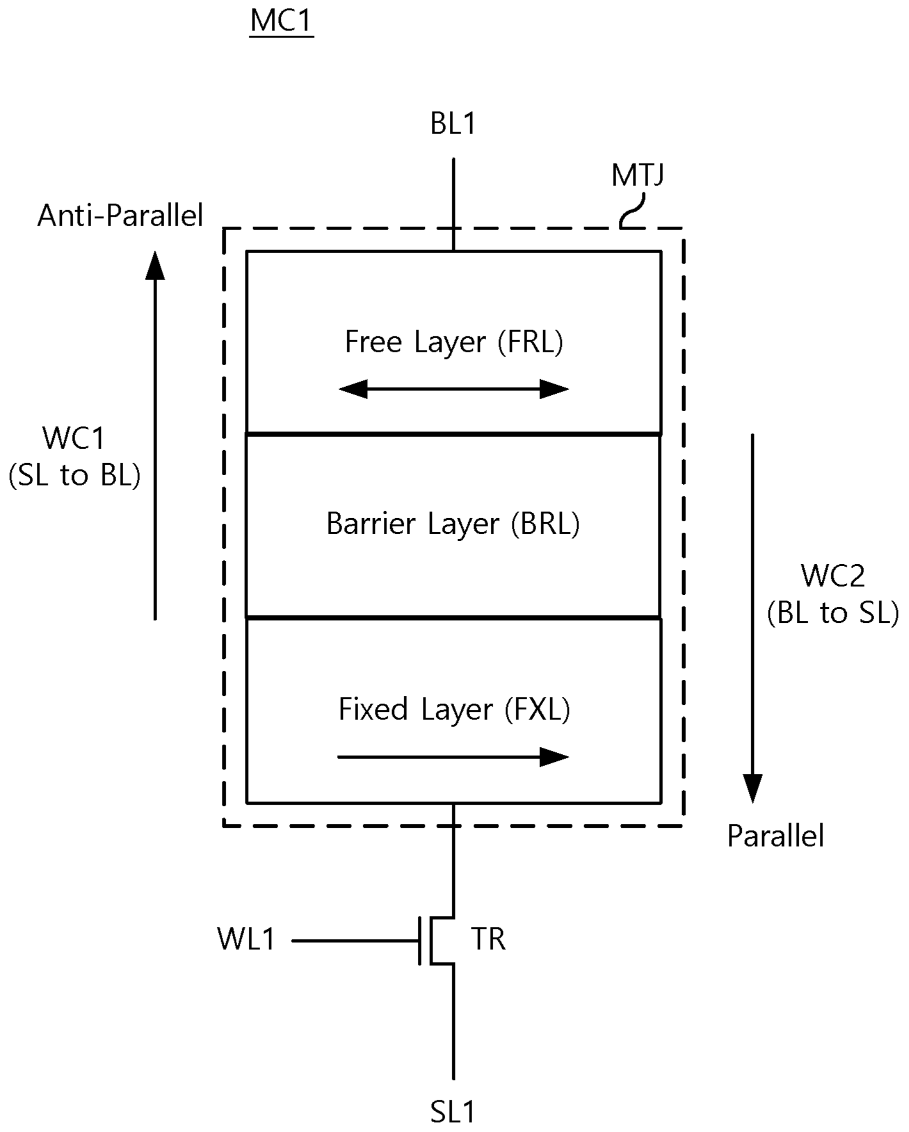
FIGS. 4 to 6 are diagrams for describing a first memory cell of FIG. 3.
Figure 5:
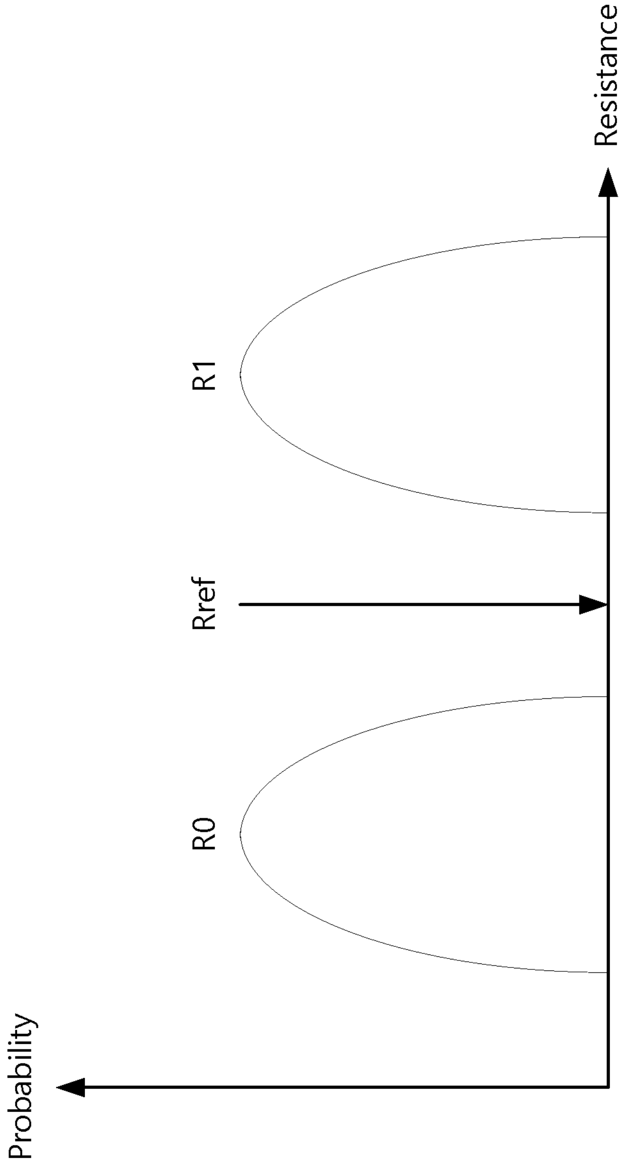
Figure 6:
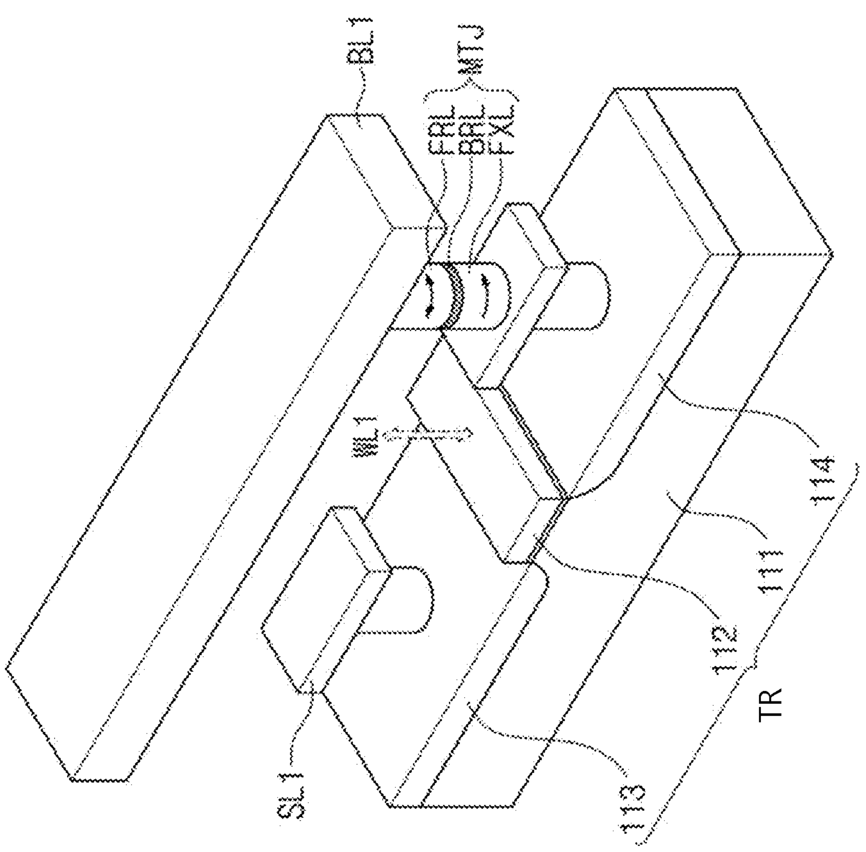

FIG. 3 is a diagram illustrating a memory cell array of FIG. 1. FIGS. 4 to 6 are diagrams for describing a first memory cell of FIG. 3. Referring to FIGS. 3 to 6, the memory cell array MCA may include a plurality of memory cells. Each of the plurality of memory cells may be an MRAM cell, and the plurality of memory cells may be connected with word lines WL1 to WLm, bit lines BL1 to BLn, and source lines SL1 to SLn.

For example, a first memory cell MC1 may include an access transistor TR and a variable resistance element MTJ (e.g., a magnetic tunnel junction). A first terminal of the access transistor TR may be connected with the first source line SL1, a second terminal of the access transistor TR may be connected with a first terminal of the variable resistance element MTJ, and a gate of the access transistor TR may be connected with the first word line WL1. A second terminal of the variable resistance element MTJ may be connected to the first bit line BL1.

Data may be stored in each of the plurality of memory cells by adjusting a resistance value of the variable resistance element MTJ of each memory cell. For example, as illustrated in FIGS. 4 and 6, the variable resistance element MTJ may include a free layer FRL, a barrier layer BRL, and a fixed layer FXL. The barrier layer BRL may be interposed between the free layer FRL and the fixed layer FXL, the free layer FRL may be connected with the first bit line BL1, and the fixed layer FXL may be connected with the second terminal of the access transistor TR.

A magnetization direction of the fixed layer FXL may be fixed to a specific direction, and a magnetization direction of the free layer FRL may be changed according to a specific condition (e.g., a direction of a write current). According to some embodiments, the variable resistance element MTJ may further include an anti-ferromagnetic layer for fixing the magnetization direction of the fixed layer FXL.

The free layer FRL may include or may be formed of a material which has a variable magnetization direction. The magnetization direction of the free layer FRL may be changed by an electrical/magnetic factor provided from outside and/or inside of a memory cell. The free layer FRL may include or may be formed of a ferromagnetic material that contains at least one of cobalt (Co), iron (Fe), and nickel (Ni). For example, the free layer FRL may include at least one selected from FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12. However, the present disclosure is not limited to these examples.

A thickness of the barrier layer BRL may be smaller than a spin diffusion distance. The barrier layer BRL may include or may be formed of a non-magnetic material. For example, the barrier layer BRL may include or may be formed of at least one selected from a group of magnesium (Mg), titanium (Ti), aluminum (Al), oxide of magnesium-zinc (MgZn) and magnesium-boron (MgB), and nitride of titanium (Ti) and vanadium (V). However, the present disclosure is not limited to these examples.

The fixed layer FXL may have a magnetization direction pinned by the anti-ferromagnetic layer. The fixed layer FXL may include or may be formed of a ferromagnetic material. For example, the fixed layer FXL may include at least one selected from a group of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and Y3Fe5O12. According to some embodiments, the anti-ferromagnetic layer may include an anti-ferromagnetic material. For example, the anti-ferromagnetic layer may include at least one selected from a group of PtMn, IrMn, MnO, MnS, MnTe, MnF2, FeCl2, FeO, CoCl2, CoO, NiCl2, NiO, and Cr. However, the present disclosure is not limited to these examples.

As illustrated in FIG. 4, the magnetization direction of the free layer FRL may be changed according to a direction of a write current WC1 or WC2 flowing through the variable resistance element MTJ. For example, referring to the first write current WC1 illustrated in FIG. 4, when a current flows in a direction from the first source line SL1 to the first bit line BL1, the magnetization direction of the free layer FRL may be opposite to the magnetization direction of the fixed layer FXL, which corresponds to an anti-parallel state of the variable resistance element MTJ. Referring to the second write current WC2 illustrated in FIG. 4, when a current flows in a direction from the first bit line BL1 to the first source line SL1, the magnetization direction of the free layer FRL may be the same as the magnetization direction of the fixed layer FXL, which corresponds to a parallel state of the variable resistance element MTJ.

With reference to FIG. 5, described in greater detail below, in the case where the variable resistance element MTJ is in the anti-parallel state, the variable resistance element MTJ may have an anti-parallel resistance value R1 greater than a reference resistance Rref. In the case where the variable resistance element MTJ is in the parallel state, the variable resistance element MTJ may have a parallel resistance value R0 smaller than the reference resistance Rref. That is, data may be stored in the first memory cell MC1 depending on a resistance value of the variable resistance element MTJ, and the data stored in the first memory cell MC1 may be read by determining the resistance value of the variable resistance element MTJ. For example, the data stored in the variable resistance element MTJ may be represented using a resistance value thereof relative to the reference resistance Rref.

When the variable resistance element MTJ is in a half-equilibrium state (i.e., the anti-parallel state), the variable resistance element MTJ may have a half-balance resistance R1 (i.e., the anti-parallel resistance value) as shown in FIG. 5. When the variable resistance element MTJ is in a balanced state (i.e., the parallel state), the variable resistance element MTJ may have a balance resistance R0 (i.e., the parallel resistance value). The memory device 1100 may distinguish data 0 or data 1 using the size of the resistance value.

The memory device 1100 may perform a read operation through comparison with the reference resistance Rref having an intermediate level between data 0 and data 1. The reference resistance Rref may be externally changed without using a fixed value when the memory device 1100 is manufactured. The reference resistance may be determined through a test operation. Data may be stored in the first memory cell MC1 according to the resistance value of the variable resistance element MTJ. Data stored in the first memory cell MC1 may be read by reading the resistance value of the variable resistance element MTJ.

Referring to FIG. 6, the access transistor TR may include a body substrate 111, a gate electrode 112, and junctions 113 and 114. The junction 113 may be formed at the body substrate 111 and may be connected to the first source line SL1. The junction 114 may be formed at the body substrate 111 and may be connected to the first bit line BL1 through the MTJ element. The gate electrode 112 may be formed on the body substrate 111 between the junctions 113 and 114 and may be connected to the first word line WL1.

Figure 7:
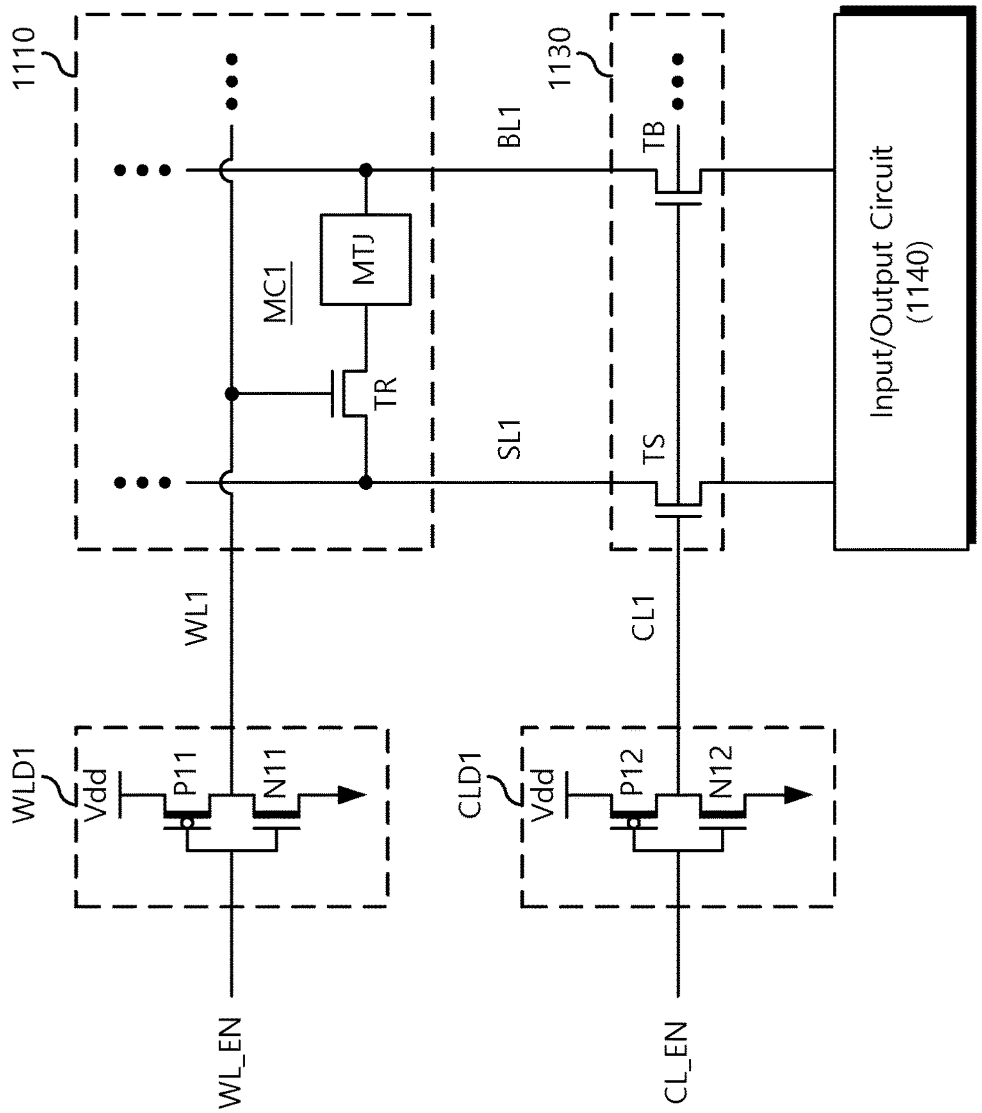
FIG. 7 is a circuit diagram illustrating a word line driver and a column line driver connected to the memory cell array shown in FIG. 5.

FIG. 7 is a circuit diagram illustrating a word line driver and a column line driver connected to the memory cell array shown in FIG. 5. Referring to FIG. 7, the word line driver and column line driver may each be configured as an inverter.

The memory cell array 1110 may include a first memory cell MC1. The first memory cell MC1 may include an access transistor TR and a variable resistance element MTJ. The access transistor TR may be connected between the first source line SL1 and the variable resistance element MTJ. The gate of the access transistor TR may be connected to the first word line WL1. The variable resistance element MTJ may be connected between the access transistor TR and the first bit line BL1.

The column decoder 1130 may include a source line transistor TS and a bit line transistor TB. The source line transistor TS may be connected between the first source line SL1 and the input/output circuit 1140. The gate of the source line transistor TS may be connected to the first column line CL1. The bit line transistor TB may be connected between the first bit line BL1 and the input/output circuit 1140. The gate of the bit line transistor TB may be connected to the first column line CL1.

The first word line driver WLD1 may be configured as an inverter including a PMOS transistor P11 and an NMOS transistor N11. The PMOS transistor P11 and the NMOS transistor N11 may be configured as high-voltage transistors that are resistant to high voltages. The PMOS transistor P11 may be connected between the power terminal and the first word line WL1. A word line enable signal WL_EN may be applied to the gate of the PMOS transistor P11. The NMOS transistor N11 may be connected between the first word line WL1 and the ground terminal. A word line enable signal WL_EN may be applied to the gate of the NMOS transistor N11 and the gate of the PMOS transistor P11. Depending on a voltage level of the word line enable signal WL_EN, one of the NMOS transistor N11 and the PMOS transistor P11 turns on. For example, in response to the word line enable signal WL_EN having a high voltage level, the NMOS transistor N11 turns on, and in response to the word line enable signal WL_EN having a low voltage level, the PMOS transistor P11 turns on. The design and fabrication of high-voltage NMOS or PMOS transistors N11 or P11 involve considerations such as optimizing channel doping, gate oxide thickness, and device geometry to ensure reliable operation under high-voltage conditions while maintaining good performance characteristics such as low on-resistance and fast switching speed.

The first column line driver CLD1 may be configured as an inverter including a PMOS transistor P12 and an NMOS transistor N12. The PMOS transistor P12 and the NMOS transistor N12 may be configured as high-voltage transistors that are resistant to high voltages. The PMOS transistor P12 may be connected between the power terminal and the first column line CL1. A column line enable signal CL_EN may be applied to the gate of the PMOS transistor P12. The NMOS transistor N12 may be connected between the first column line CL1 and the ground terminal. A column line enable signal CL_EN may be applied to the gate of the NMOS transistor N12 and the PMOS transistor P12. Depending on a voltage level of the column line enable signal CL_EN, one of the NMOS transistor N12 and the PMOS transistor P12 turns on. For example, in response to the column line enable signal CL_EN having a high voltage level, the NMOS transistor N12 turns on, and in response to the column line enable signal CL_EN having a low voltage level, the PMOS transistor P12 turns on. The design and fabrication of high-voltage NMOS or PMOS transistors N12 or P12 involve considerations such as optimizing channel doping, gate oxide thickness, and device geometry to ensure reliable operation under high-voltage conditions while maintaining good performance characteristics such as low on-resistance and fast switching speed.

Figure 8:
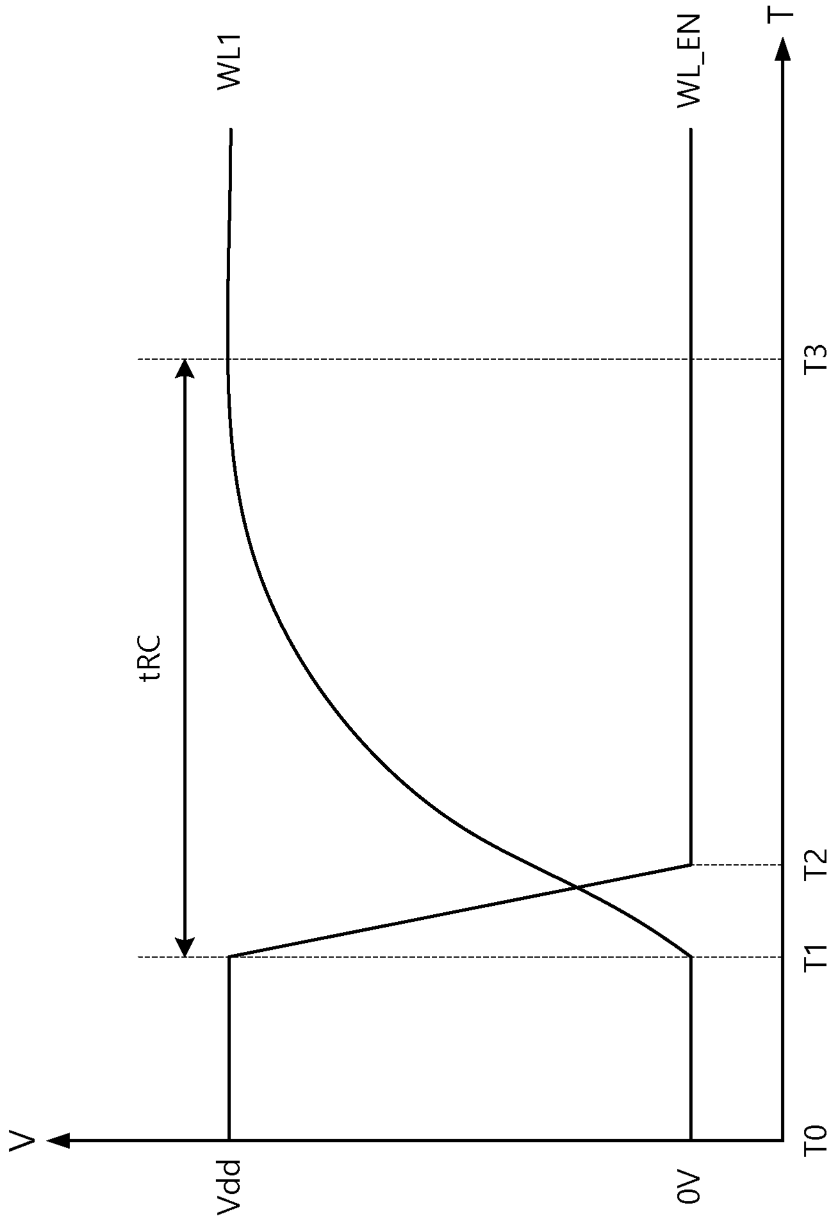
FIG. 8 is a graph illustrating the voltage level of the first word line WL1 when the word line enable signal is applied to the first word line driver shown in FIG. 7.

FIG. 8 is a graph illustrating the voltage level of the first word line WL1 when the word line enable signal is applied to the first word line driver shown in FIG. 7. When the column line enable signal CL_EN is applied to the first column line driver CLD1 shown in FIG. 7, the first column line CL1 may have the same or similar voltage level as the first word line.

In the period T0 to T1, the voltage level of the word line enable signal WL_EN may be a power supply voltage Vdd. In an embodiment, the power supply voltage Vdd may be applied to the memory device, which correspond to the external power PWR of FIG. 1. When the word line enable signal WL_EN is the power supply voltage Vdd, the PMOS transistor P11 is turned off and the NMOS transistor N11 is turned on. Accordingly, the voltage level of the first word line WL1 may be ground voltage or 0V.

In the period T1 to T2, the voltage level of the word line enable signal WL_EN may transition from the power supply voltage Vdd to 0V. When the word line enable signal WL_EN transitions to 0V, the PMOS transistor P11 may be turned on and the NMOS transistor N11 may be turned off.

In the period T2 to T3, the voltage level of the first word line WL1 may rise from 0V to the power supply voltage Vdd. If the transition time of the word line enable signal WL_EN is T2-T1, the rising time of the first word line WL1 may be T3-T1. The rising time of the first word line WL1 may vary depending on the number of memory cells connected to the first word line WL1. As the number of memory cells connected to the first word line WL1 increases, the delay time (tRC) due to the resistance and the capacitance of the first word line WL1 may increase.

There may be several ways to reduce the delay time (tRC). For example, by increasing the size of the PMOS transistor P11 and NMOS transistor N11 in the first word line driver WLD1, the delay time (tRC) may be reduced. In some embodiments, the delay time (tRC) may be reduced by changing the internal configuration of the first word line driver WLD1 or changing the level of the power voltage applied to the power terminal. Example embodiments for changing the internal configuration of the word line driver or changing the level of the power supply voltage will be described in detail below.

Figure 9:
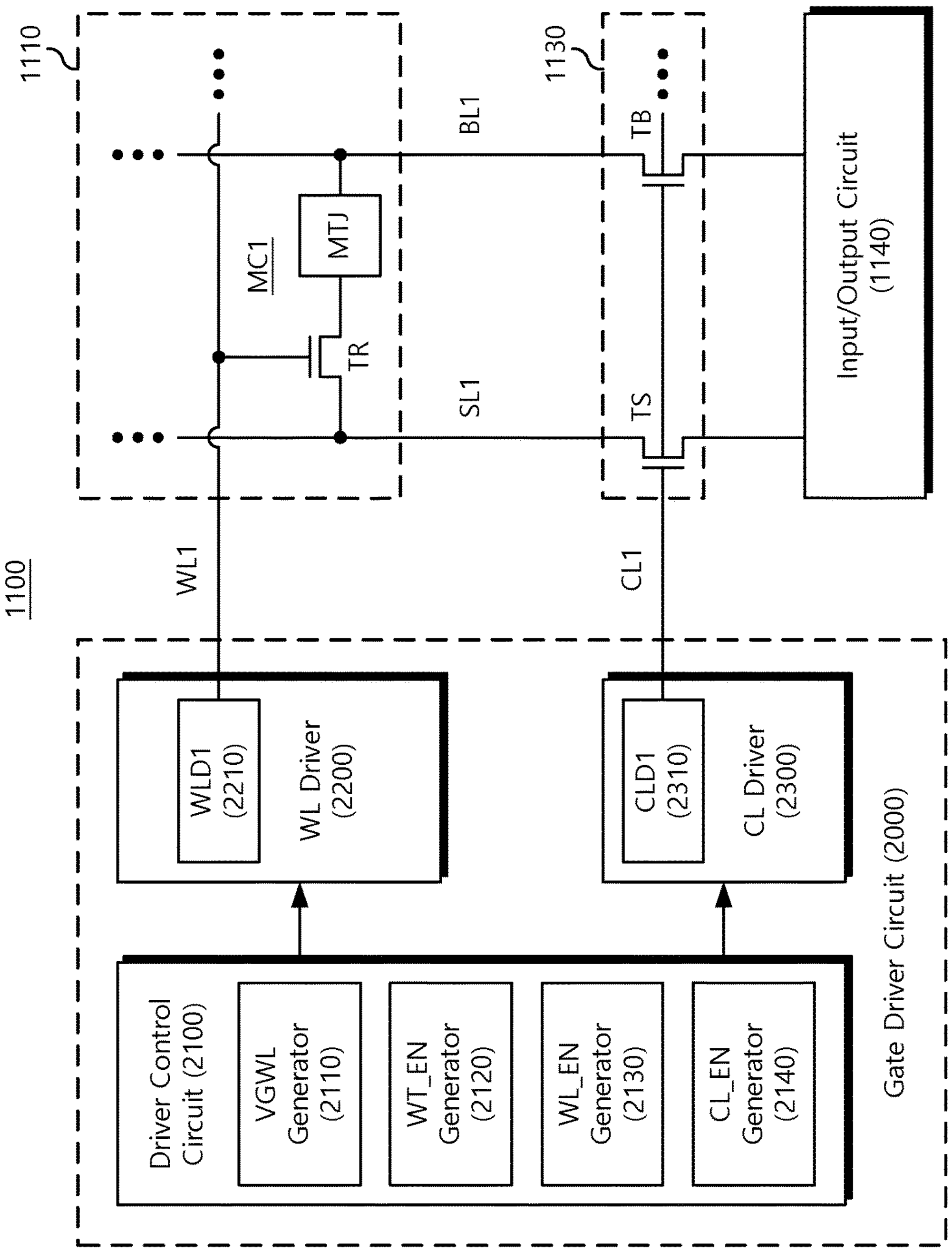
FIG. 9 is a block diagram illustrating a memory device including a gate driver circuit according to an example embodiment of the present disclosure.

FIG. 9 is a block diagram illustrating a memory device including a gate driver circuit according to an example embodiment of the present disclosure. Referring to FIG. 9, the memory device 1100 may include a memory cell array 1110, a column decoder 1130, an input/output circuit 1140, and a gate driver circuit 2000.

The memory cell array 1110 may include a first memory cell MC1. The first memory cell MC1 may include an access transistor TR and a variable resistance element MTJ. The access transistor TR may be connected between the first source line SL1 and the variable resistance element MTJ. The gate of the access transistor TR may be connected to the first word line WL1. The variable resistance element MTJ may be connected between the access transistor TR and the first bit line BL1.

The column decoder 1130 may include a source line transistor TS and a bit line transistor TB. The source line transistor TS may be connected between the first source line SL1 and the input/output circuit 1140. The gate of the source line transistor TS may be connected to the first column line CL1. The bit line transistor TB may be connected between the first bit line BL1 and the input/output circuit 1140. The gate of the bit line transistor TB may be connected to the first column line CL1.

The gate driver circuit 2000 may include a driver control circuit 2100, a word line driver 2200, and a column line driver 2300. The driver control circuit 2100 may provide control signals such as a write enable signal, a word line enable signal, and a column line enable signal to a word line driver 2200 and/or a column line driver 2300 during a read or write operation.

The driver control circuit 2100 may include a VGWL generator 2110, a WT_EN generator 2120, a WL_EN generator 2130, and a CL_EN generator 2140. The VGWL generator 2110 may generate a gate control voltage VGWL. The gate control voltage VGWL may be provided to the word line driver 2200 and/or the column line driver 2300. The WT_EN generator 2120 may generate a write enable signal WT_EN. The write enable signal WT_EN may be provided to the word line driver 2200 and/or the column line driver 2300.

The WL_EN generator 2130 may generate a word line enable signal WL_EN. The word line enable signal WL_EN may be provided to the word line driver 2200. The CL_EN generator 2140 may generate a column line enable signal CL_EN. The column line enable signal CL_EN may be provided to the column line driver 2300.

The word line driver 2200 may receive the gate control voltage VGWL, the write enable signal WT_EN, and the word line enable signal WL_EN from the driver control circuit 2100 and may perform read or write operations. The word line driver 2200 may include a first word line driver (WLD1, 2210). The first word line driver 2210 may be connected to the first word line WL1. The first word line driver 2210 may provide word line voltages to the first word line during a read or write operation.

The column line driver 2300 may receive the gate control voltage VGWL, the write enable signal WT_EN, and the column line enable signal CL_EN from the driver control circuit 2100 and may perform read or write operations. The column line driver 2300 may include a first column line driver (CLD1, 2310). The first column line driver 2310 may be connected to the first column line CL1. The first column line driver 2310 may control the on or off operation of the source line transistor TS and/or bit line transistor TB.

Figure 10:
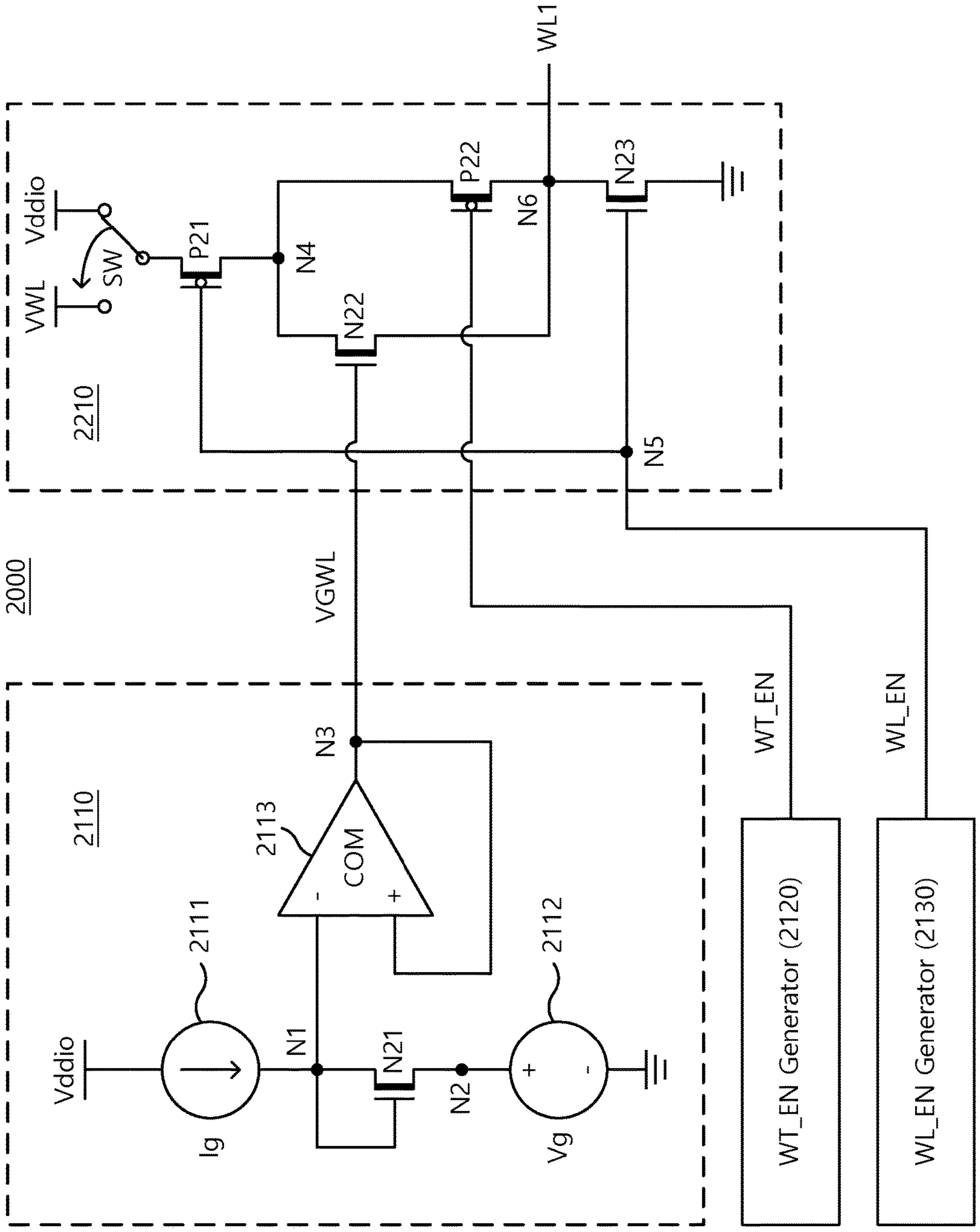
FIGS. 10 and 11 are circuit diagrams illustrating an example embodiment of the gate driver circuit shown in FIG. 9.
Figure 11:
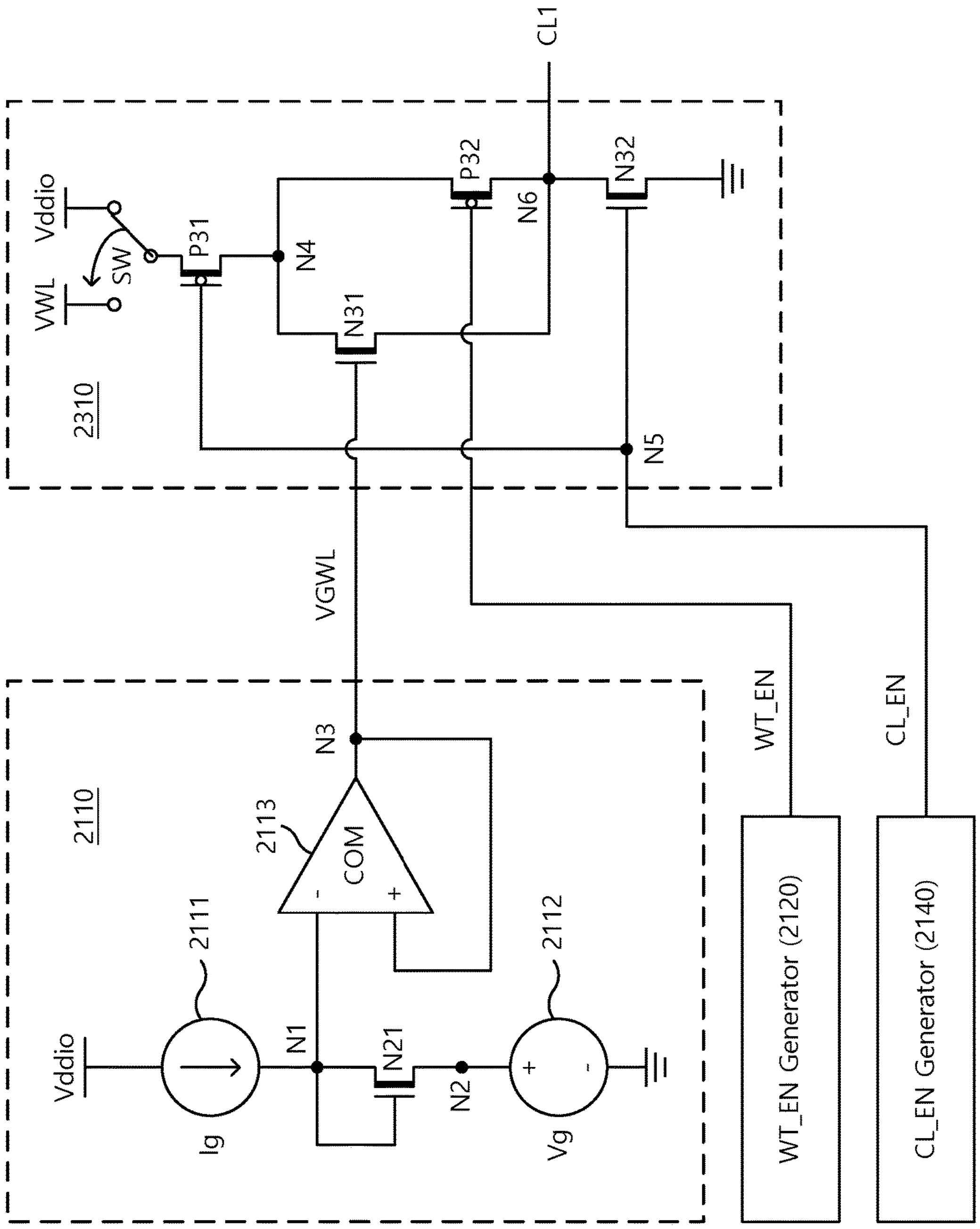

FIGS. 10 and 11 are circuit diagrams illustrating an example embodiment of the gate driver circuit shown in FIG. 9. Referring to FIGS. 10 and 11, the gate driver circuit 2000 may include a VGWL generator 2110, a WT_EN generator 2120, a WL_EN generator 2130, a CL_EN generator 2140, a first word line driver 2210, and a first column line driver 2310.

Referring to FIG. 10, the VGWL generator 2110 may provide a gate control voltage VGWL to the first word line driver 2210. The VGWL generator 2110 may include a current generator 2111, a voltage generator 2112, a comparator (COM, 2113), and an NMOS transistor N21. The VGWL generator 2110 may receive a power supply voltage Vddio through a power terminal. The power supply voltage Vddio may be input through the control logic 1160 shown in FIG. 2. The power supply voltage Vddio may be higher than the power supply voltage Vdd. For example, the power supply voltage Vddio may be approximately 1.8V and the power supply voltage Vdd may be approximately 1V.

The current generator 2111 may be connected between a power terminal supplying the power supply voltage Vddio and a first node N1. The current generator 2111 may receive the power supply voltage Vddio from the power terminal and generate an Ig current. The voltage generator 2112 may be connected between a second node N2 and the ground terminal. The voltage generator 2112 may generate a Vg voltage.

The comparator (COM, 2113) may have a (−) input terminal, a (+) input terminal, and an output terminal. The (−) input terminal of the comparator 2113 may be connected to the first node N1. And the (+) input terminal may be connected to a third node N3. The output terminal of the comparator 2113 may be connected to the third node N3. The comparator 2113 may compare the voltage levels of the first node N1 and the third node N3 and generate a gate control voltage VGWL according to the comparison result. For example, the comparator 2113 may output a high level gate control voltage VGWL when the voltage level of the third node N3 is higher than the voltage level of the first node N1.

The NMOS transistor N21 may be connected between the first node N1 and the second node N2. The gate of the NMOS transistor N21 may be connected to the first node N1. The NMOS transistor N21 may be a high voltage transistor that is durable to high voltage. The NMOS transistor N21 may have a diode structure in which the drain and gate are connected. The drain and gate of the NMOS transistor N21 may be connected to the (−) input terminal of the comparator 2113.

The first word line driver 2210 may selectively receive the word line voltage VWL or the power supply voltage Vddio from the power terminal. The first word line driver 2210 may receive the word line voltage VWL or the power supply voltage Vddio through the control logic 1160 shown in FIG. 2. The word line voltage VWL may be higher than the power supply voltage Vddio. For example, VWL may be approximately 2V and the power supply voltage Vddio may be approximately 1.8V.

The first word line driver 2210 may include PMOS transistors (P21, P22) and NMOS transistors (N22, N23). The PMOS transistors (P21, P22) and NMOS transistors (N22, N23) may be high voltage transistors that are durable to a high voltage. For example, the first word line driver 2210 may include a PMOS transistor P21, an NMOS transistor N22, and an inverter-structured PMOS transistor P22 and NMOS transistor N23.

The PMOS transistor P21 may be connected between the power terminal and a fourth node N4. The PMOS transistor P21 may receive the word line voltage VWL or the power supply voltage Vddio in response to the switch signal SW provided from the control logic 1160. The gate of the PMOS transistor P21 may be connected to a fifth node N5. The PMOS transistor P21 may receive the word line enable signal WL_EN through the WL_EN generator 2130. The PMOS transistor P22 may be connected between the fourth node N4 and a sixth node N6. The PMOS transistor P22 may receive the write enable signal WT_EN through the WT_EN generator 2120.

The NMOS transistor N22 may be connected between the fourth node N4 and the sixth node N6. The gate control voltage VGWL may be provided to the gate of the NMOS transistor N22. The NMOS transistor N22 may perform an on or off operation depending on the gate control voltage VGWL. If the difference between the gate voltage and source voltage of the NMOS transistor N22 is higher than the threshold voltage, the NMOS transistor N22 may be turned on. If the threshold voltage of the NMOS transistor N22 is about 0.4V, it may be turned on when the voltage difference between VGWL and the sixth node N6 is higher than 0.4V.

The NMOS transistor N23 may be connected between the sixth node N6 and the ground terminal. The gate of the NMOS transistor N23 may be connected to the fifth node N5. The word line enable signal WL_EN may be provided to the gate of the NMOS transistor N23. The drain of the NMOS transistor N23 may be connected to the first word line WL1.

Referring to FIG. 11, the VGWL generator 2110 may provide a gate control voltage VGWL to the first column line driver 2310. The VGWL generator 2110 may simultaneously provide a gate control voltage VGWL to the first word line driver 2210 shown in FIG. 10. According to an example embodiment, a VGWL generator for providing a gate control voltage VGWL to the first word line driver 2210 and a VGWL generator for providing a gate control voltage VGWL to the first column line driver 2310 may be separately provided.

The first column line driver 2310 may selectively receive the word line voltage VWL or the power supply voltage Vddio from the power terminal. The first column line driver 2310 may include PMOS transistors (P31 and P32) and NMOS transistors (N31 and N32). The PMOS transistors (P31, P32) and NMOS transistors (N31, N32) may be high voltage transistors that are durable to a high voltage. For example, the first column line driver 2310 may include a PMOS transistor P31, an NMOS transistor N31, and an inverter-structured PMOS transistor P32 and NMOS transistor N32.

The PMOS transistor P31 may be connected between the power terminal and a fourth node N4. The gate of the PMOS transistor P31 may be connected to a fifth node N5. The PMOS transistor P31 may receive the column line enable signal CL_EN through the CL_EN generator 2140. The PMOS transistor P32 may be connected between the fourth node N4 and a sixth node N6. The PMOS transistor P32 may receive the write enable signal WT_EN through the WI_EN generator 2120.

The NMOS transistor N31 may be connected between the fourth node N4 and a sixth node N6. The gate control voltage VGWL may be provided to the gate of the NMOS transistor N31. If the difference between the gate voltage and source voltage of the NMOS transistor N31 is higher than the threshold voltage, the NMOS transistor N31 may be turned on. The NMOS transistor N32 may be connected between the sixth node N6 and the ground terminal. The NMOS transistor N32 may be controlled according to the column line enable signal CL_EN. The drain of the NMOS transistor N32 may be connected to the first column line CL1.

Figure 12:
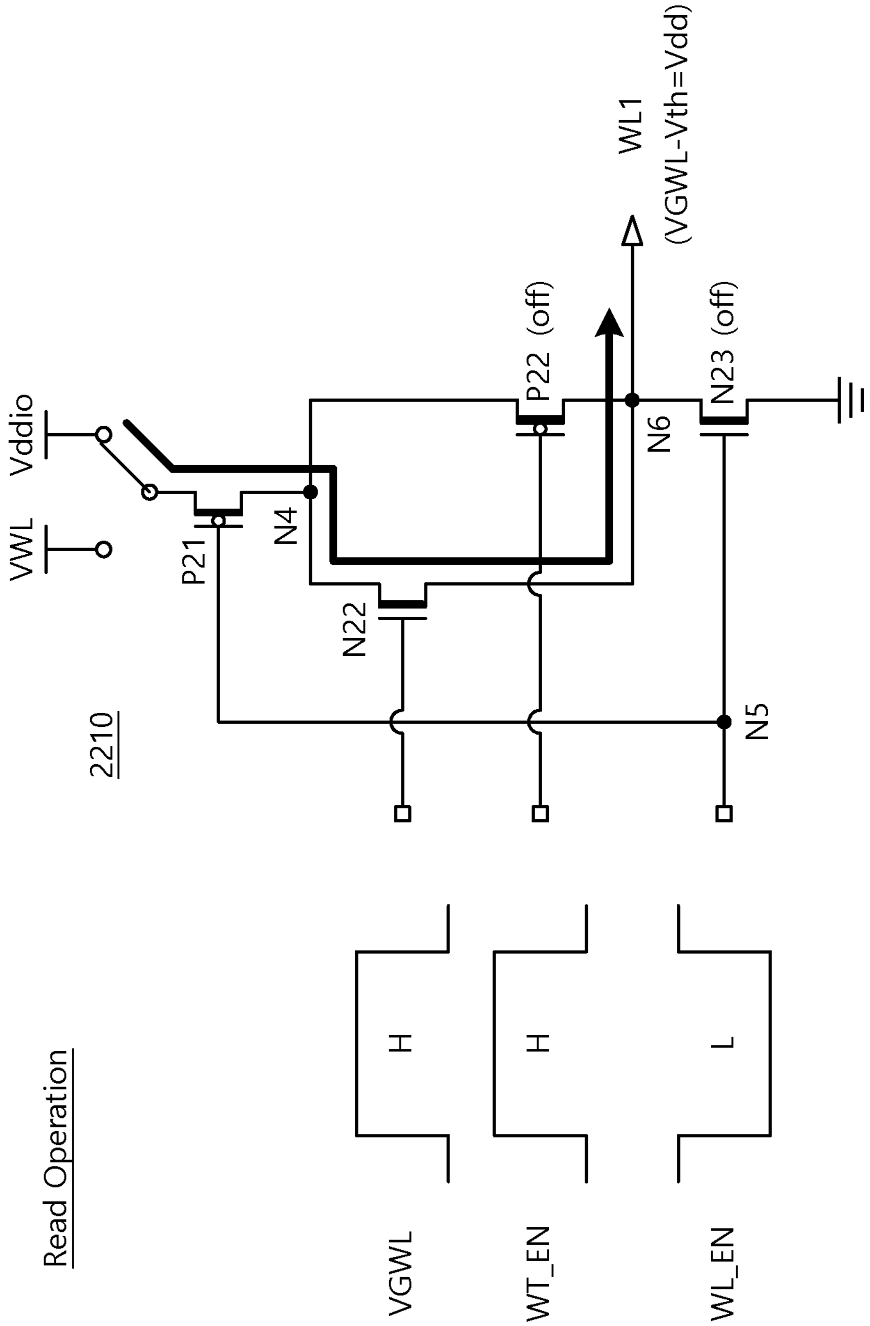
FIGS. 12 and 13 are circuit diagrams illustrating example embodiments of the operation methods of the first word line driver shown in FIG. 10.
Figure 13:
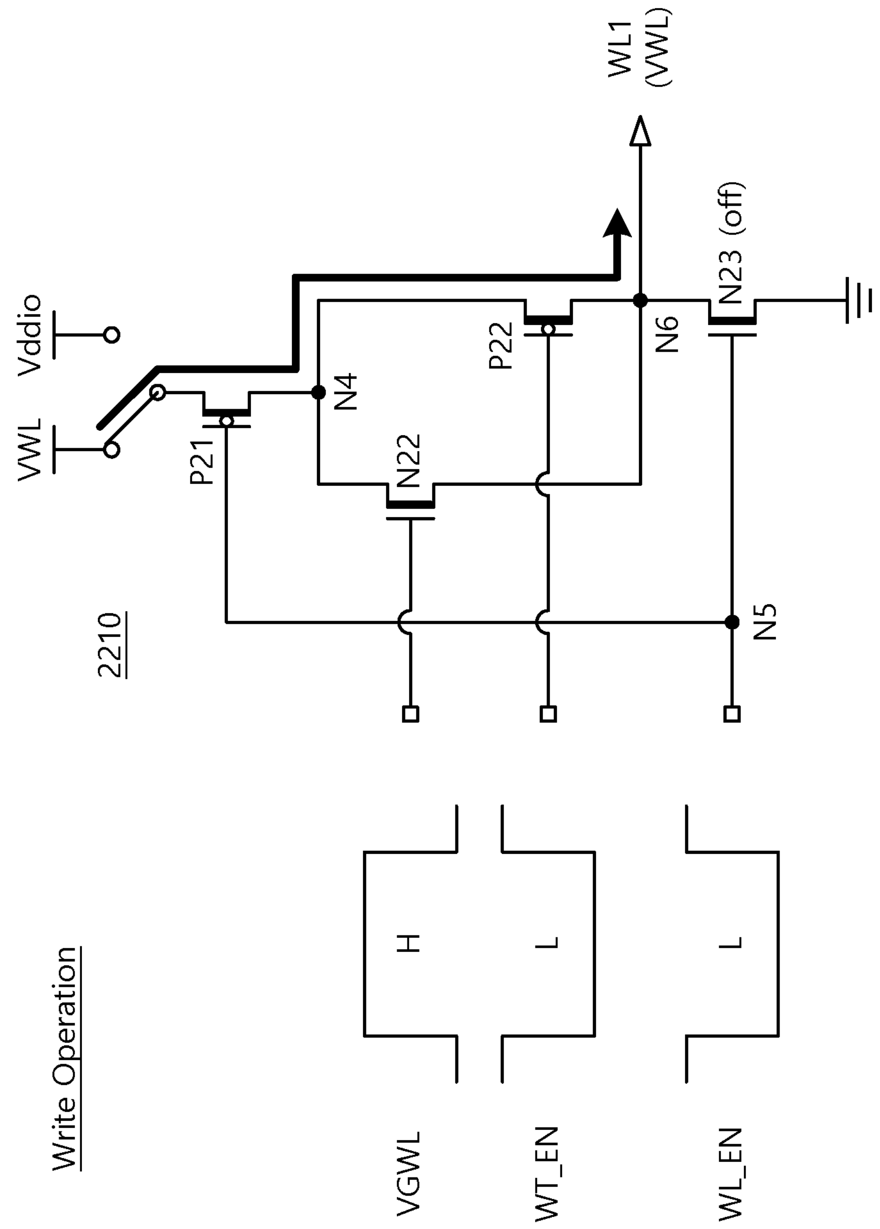

FIGS. 12 and 13 are circuit diagrams illustrating example embodiments of the operation methods of the first word line driver shown in FIG. 10. FIG. 12 shows bias conditions and current flow during a read operation of the first word line driver 2210, and FIG. 13 shows bias conditions and current flow during a write operation.

Referring to FIG. 12, the first word line driver 2210 may receive a power supply voltage Vddio from a power terminal during a read operation. The PMOS transistor P21 may receive a low level (L) word line enable signal WL_EN. The PMOS transistor P21 may be turned on, and a current path may be formed between the power terminal and the fourth node N4. The PMOS transistor P22 may receive a high level (H) write enable signal WT_EN. The PMOS transistor P22 may be turned off.

The NMOS transistor N22 may receive a high level (H) gate control voltage VGWL. The NMOS transistor N22 may be turned on, and a current path may be formed between the fourth node N4 and the sixth node N6. The NMOS transistor N23 may receive a low level (L) word line enable signal WL_EN. The NMOS transistor N23 may be turned off.

The first word line driver 2210 may use the power supply voltage Vddio (e.g., 1.8V) higher than the power supply voltage Vdd (e.g., 1.0V) during a read operation. The first word line driver 2210 may attenuate the power supply voltage Vddio voltage in the NMOS transistor N22 and provide the power supply voltage Vdd voltage to the first word line WL1. The first word line driver 2210 may provide a gate control voltage VGWL to the gate of the NMOS transistor N22 to attenuate the power supply voltage Vddio voltage in the NMOS transistor N22. For example, the VGWL having a voltage level of a sum of the power supply voltage Vdd and Vth may be 1.4V. Here, Vth (e.g., 0.4V) is the threshold voltage of the NMOS transistor N22.

Threshold voltage attenuation may occur at the NMOS transistor N22 in the first word line driver 2210. However, since the first word line driver 2210 uses the power supply voltage Vddio instead of the power supply voltage Vdd as a power supply voltage during a read operation, a higher drain-source voltage than before may be applied to the NMOS transistor N22, and thus the first word line driver 2210 may reduce the rising time of the first word line voltage during a read operation. For example, increasing the supply voltage of the NMOS transistor N22 can improve the charging speed of the capacitive load of the first word line WL1, thus reducing the rising time.

As the number of memory cells connected to the first word line WL1 increases, the delay time (tRC) due to the resistance and the capacitance of the first word line WL1 may increase. The first word line driver 2210 may receive the power supply voltage Vddio higher than the power supply voltage Vdd during a read operation and may reduce delay time (tRC) through the gate control voltage VGWL applied to the NMOS transistor N22.

Referring to FIG. 13, the first word line driver 2210 may receive the word line voltage VWL from the power terminal during a write operation. The PMOS transistor P21 may receive a low level (L) word line enable signal WL_EN. The PMOS transistor P21 may be turned on, and a current path may be formed between the power terminal and the fourth node N4. The PMOS transistor P22 may receive a low level (L) write enable signal WT_EN. The PMOS transistor P22 is turned on, and a current path may be formed between the fourth node N4 and the sixth node N6.

The NMOS transistor N22 may receive a high-level (H) gate control voltage VGWL. And the NMOS transistor N23 may receive a low-level (L) word line enable signal WL_EN. The NMOS transistor N23 may be turned off.

The first word line driver 2210 may use the word line voltage (VWL, for example, 2V) during a write operation. And the first word line driver 2210 may provide the word line voltage VWL to the first word line WL1 through the PMOS transistors (P21 and P22). Since the first word line driver 2210 uses the current path of the PMOS transistors (P21 and P22), threshold voltage attenuation does not occur. The first word line driver 2210 may provide the word line voltage VWL to the first word line WL1.

Figure 14:
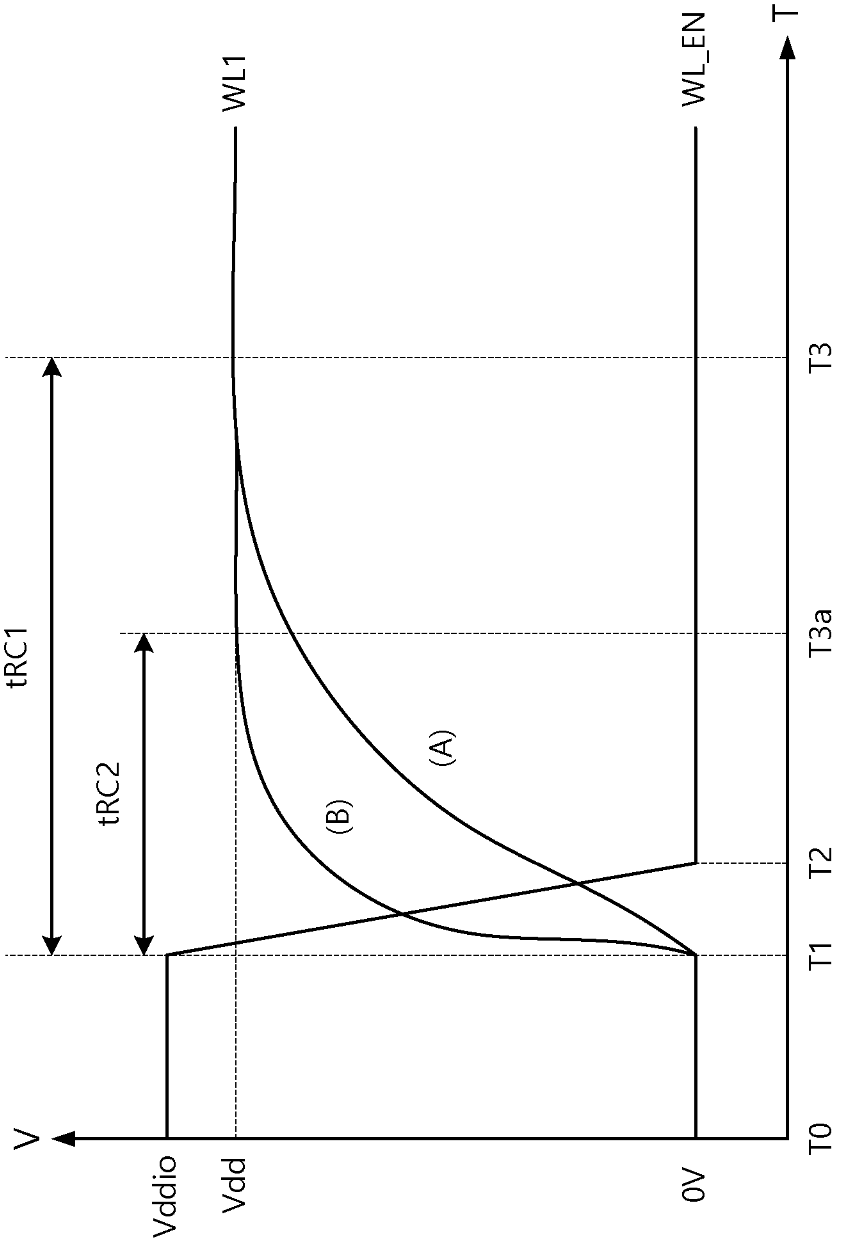
FIG. 14 is a graph illustrating the voltage level of the word line during a read operation of the word line driver shown in FIG. 12.

FIG. 14 is a graph illustrating the voltage level of the word line during a read operation of the word line driver shown in FIG. 12. In FIG. 14, (A) curve shows the word line voltage level during a read operation of the word line driver with the inverter structure shown in FIGS. 7 and 8. (B) curve shows the word line voltage level during the read operation of the word line driver shown in FIG. 12.

In the period T0 to T1, the voltage level of the word line enable signal WL_EN may be the power supply voltage Vddio. When the word line enable signal WL_EN is the power supply voltage Vddio, the PMOS transistor P21 is turned off and the NMOS transistor N23 is turned on. Accordingly, the voltage level of the first word line WL1 may be ground voltage or 0V.

In the period T1 to T2, the voltage level of the word line enable signal WL_EN may transition from the power supply voltage Vddio to 0V. When the word line enable signal WL_EN transitions to 0V, the PMOS transistor P21 is turned on and the NMOS transistor N23 is turned off.

In the period T1~T3*a*, the voltage level of the first word line WL1 may rise from 0V to the power supply voltage Vdd. At this time, the voltage level of the first word line WL1 may rise to the power supply voltage Vdd through attenuation of the threshold voltage of the NMOS transistor N22. If the transition time of the word line enable signal WL_EN is T2-T1, the rising time of the first word line WL1 may be T3*a*-T1.

As the number of memory cells connected to the first word line WL1 increases, the delay time (tRC) due to the resistance component and capacitor component may increase. The first word line driver 2210 may use the power supply voltage Vddio higher than the power supply voltage Vdd during a read operation. The first word line driver 2210 may reduce the delay time from tRC1 to tRC2 by the time T3-T3*a*.

According to the present disclosure, it may be possible to reduce the decrease in operating speed due to resistance or capacitor components of word lines or memory cells. A gate driver circuit may reduce the rising time of the word line voltage even if the rising time of the word line voltage increases due to an increase in the number of memory cells connected to one word line.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:
- a memory cell having an access transistor and a variable resistance element;
- a word line connected to a gate of the access transistor; and
- a gate driver circuit configured to:
- provide gate control signal to the word line in a read operation or a write operation,
- receive, during the read operation, a first power supply voltage supplied from a power terminal and provide the gate control signal having a second power supply voltage lower than the first power supply voltage to the word line by attenuating the first power supply voltage to the second power supply voltage, and
- receive, during the write operation, a third power supply voltage higher than the first power supply voltage from the power terminal and provide the gate control signal having the third power supply voltage to the word line without attenuating the third power supply voltage.

2. The memory device of claim 1,
- wherein the gate driver circuit includes an N-type metal-oxide-semiconductor (NMOS) transistor which is configured to provide the second power supply voltage through attenuating the first power supply voltage by a threshold voltage of the NMOS transistor during the read operation, and
- wherein the gate driver circuit further includes a P-type metal-oxide-semiconductor (PMOS) transistor which is configured to provide the third power supply voltage without attenuating the third power supply voltage.

3. The memory device of claim 2,
- wherein each of the NMOS transistor and the PMOS transistor is a high-voltage transistor that operates at a voltage higher than a power supply voltage that is supplied to the memory device.

4. The memory device of claim 1,
- wherein the gate driver circuit includes:
- a word line driver circuit configured to receive the first power supply voltage and the third power supply voltage and selectively provide one of the second power supply voltage and the third power supply voltage to the word line; and a driver control circuit configured to control the word line driver circuit.

5. The memory device of claim 4, wherein the word line driver circuit includes:

a first PMOS transistor connected between the power terminal and a first node, and having a gate electrode receiving a word line enable signal;

a second PMOS transistor connected between the first node and a second node connected to the word line, and having a gate electrode receiving a write enable signal;

a first NMOS transistor connected between the first node and the second node, and having a gate electrode receiving the gate control signal; and a second NMOS transistor connected between the second node and a ground terminal, and having a gate electrode receiving the word line enable signal, and wherein the driver control circuit is configured to provide the word line enable signal, the write enable signal, and the gate control signal.

6. The memory device of claim 5, wherein each of the first PMOS transistor, the second PMOS transistor, the first NMOS transistor, and the second NMOS transistor is a high-voltage transistor that operates at a voltage higher than a power supply voltage that is supplied to the memory device.

7. The memory device of claim 5, wherein the driver control circuit is configured to control the word line driver circuit to provide the second power supply voltage to the word line through the first PMOS transistor and the first NMOS transistor during the read operation.

8. The memory device of claim 5, wherein the driver control circuit is configured to control the word line driver circuit to provide the third power supply voltage to the word line through the first PMOS transistor and the second PMOS transistor during the write operation.

9. The memory device of claim 5, wherein a voltage level of the gate control signal corresponds to a sum of the second power supply voltage and a threshold voltage of the first NMOS transistor.

10. The memory device of claim 1, wherein the memory cell is a magnetoresistive random-access memory-(MRAM) memory cell.

11. A memory device comprising:

a memory cell array including a word line and a plurality of memory cells connected thereto;

a column decoder connected to the plurality of memory cells through a plurality of source lines and a plurality of bit lines and configured to select the plurality of memory cells by a column line; and a gate driver circuit configured to:

provide a gate control signal to the word line in a read operation or a write operation, receive, during the read operation, a first power supply voltage from a power terminal and provide the gate control signal having a second power supply voltage lower than the first power supply voltage to the word line by attenuating the first power supply voltage to the second power supply voltage, and receive, during the write operation, a third power supply voltage higher than the first power supply voltage from the power terminal and provide the gate control signal having the third power supply voltage to the word line without attenuating the third power supply voltage.

12. The memory device of claim 11, wherein the gate driver circuit includes an NMOS transistor which is configured to provide the second power supply voltage through attenuating the first power supply voltage by a threshold voltage of the NMOS transistor during the read operation, and wherein the gate driver circuit further includes a PMOS transistor which is configured to provide the third power supply voltage without attenuation of the third power supply voltage.

13. The memory device of claim 11, wherein the gate driver circuit includes:

a word line driver circuit configured to receive the first power supply voltage and the third power supply voltage, and selectively provide one of the second power supply voltage and the third power supply voltage to the word line;

a column line driver circuit configured to receive the first power supply voltage and the third power supply voltage, and selectively provide one of the second power supply voltage and the third power supply voltage to the column line; and a driver control circuit configured to control the word line driver circuit and the column line driver circuit.

14. The memory device of claim 13, wherein the word line driver circuit includes:

a first PMOS transistor connected between the power terminal and a first node, and having a gate electrode receiving a word line enable signal;

a second PMOS transistor connected between the first node and a second node connected to the word line, and having a gate electrode receiving a write enable signal;

a first NMOS transistor connected between the first node and the second node, and having a gate electrode receiving the gate control signal; and a second NMOS transistor connected between the second node and a ground terminal, and having a gate electrode receiving the word line enable signal, and wherein the driver control circuit is configured to provide the word line enable signal, the write enable signal, and the gate control signal.

15. The memory device of claim 14, wherein the driver control circuit is configured to control the word line driver circuit to provide the second power supply voltage to the word line through the first PMOS transistor and the first NMOS transistor during the read operation.

16. The memory device of claim 14, wherein the driver control circuit is configured to control the word line driver circuit to provide the third power supply voltage to the word line through the first PMOS transistor and the second PMOS transistor during the write operation.

17. The memory device of claim 13, wherein the column line driver circuit includes:

a first PMOS transistor connected between the power terminal and a first node, and having a gate electrode receiving a column line enable signal;

a second PMOS transistor connected between the first node and a second node connected to the column line, and having a gate electrode receiving a write enable signal;

a first NMOS transistor connected between the first node and the second node, and having a gate electrode receiving the gate control signal; and a second NMOS transistor connected between the second node and a ground terminal, and having a gate electrode receiving the column line enable signal, and wherein the driver control circuit is configured to provide the column line enable signal, the write enable signal, and the gate control signal.

18. The memory device of claim 17, wherein the driver control circuit is configured to control the column line driver circuit to provide the second power supply voltage to the column line through the first PMOS transistor and the first NMOS transistor during the read operation.

19. The memory device of claim 17, wherein the driver control circuit is configured to control the column line driver circuit to provide the third power supply voltage to the column line through the first PMOS transistor and the second PMOS transistor during the write operation.

20. A gate driver circuit of a memory device comprising:

a driver control circuit configured to generate a word line enable signal, a write enable signal, and a gate control signal;

a first PMOS transistor connected between a power terminal and a first node, and configured to operate in response to the word line enable signal;

a second PMOS transistor connected between the first node and a second node connected to a word line, and configured to operate in response to the write enable signal;

a first NMOS transistor connected between the first node and the second node, and configured to operate in response to the gate control signal; and a second NMOS transistor connected between the second node and a ground terminal, and configured to operate in response to the word line enable signal, wherein during a read operation, the gate driver circuit receives a first power supply voltage from the power terminal and provides the gate control signal having a second power supply voltage lower than the first power supply voltage to the word line through attenuating the first power supply voltage to the second power supply voltage, and wherein during a write operation, the gate driver circuit receives a third power supply voltage higher than the first power supply voltage from the power terminal and provides the third power supply voltage to the word line without attenuating the third power supply voltage.

* * * * *